United States Patent [19]

Galli

[11] 3,724,068

[45] Apr. 3, 1973

[54] SEMICONDUCTOR CHIP PACKAGING APPARATUS AND METHOD

[75] Inventor: Richard J. Galli, Wilmington, Del.

[73] Assignee: E. I. du Pont de Nemours and Company, Wilmington, Del.

[22] Filed: Feb. 25, 1971

[21] Appl. No.: 118,805

[52] U.S. Cl. ..................... 29/626, 29/203 B, 29/430, 29/471.1, 29/593, 219/85, 228/6, 228/47

[51] Int. Cl. .............................................. H05k 3/30

[58] Field of Search ............ 228/3, 4, 5, 6, 44, 47, 49; 29/589, 470.1, 471.1, 592, 626, 627, 593, 429, 430, 203 B; 219/85; 156/3

[56] References Cited

UNITED STATES PATENTS

| | | | |
|---|---|---|---|
| 3,440,027 | 4/1969 | Hugle | 29/627 X |
| 3,442,432 | 5/1969 | Santangini | 228/44 |
| 3,452,917 | 7/1969 | Schneider | 228/3.5 |
| 3,465,408 | 9/1969 | Clark et al. | 228/5 X |

*Primary Examiner*—J. Spencer Overholser
*Assistant Examiner*—Robert J. Craig
*Attorney*—James A. Forstner

[57] ABSTRACT

An apparatus for packaging semiconductor device chips (e.g., integrated circuit chips) using flexible transparent carrier strips having metallizations thereon. This apparatus accomplishes inboard bonding of the active face of the chip to the carrier metallizations, die bonding of the nonactive face of the chip to the substrate, and outboard bonding of the carrier metallizations to substrate metallizations, to form a package. Also, an apparatus for the inboard bonding step, as well as an apparatus for die and outboard bonding. Continuous automated bonding at high rates is possible using this apparatus. Also, a method for packaging chips.

21 Claims, 5 Drawing Figures

INVENTOR
RICHARD J. GALLI

BY James A. Forstner
ATTORNEY

INVENTOR
RICHARD J. GALLI

BY James A. Forstner
ATTORNEY

SEMICONDUCTOR CHIP PACKAGING APPARATUS AND METHOD

CROSS-REFERENCE TO COPENDING APPLICATION

This application is copending with and commonly assigned to application Ser. No. 118,803, now abandoned filed on the same days as the present application, and entitled "Chip Carriers." The latter application concerns carriers used in the apparatus and method of the present application.

BACKGROUND OF THE INVENTION

This invention relates to semiconductor devices or chips, and more specifically, apparatus for mounting such chips in a package using flexible carriers.

The term "semiconductor device" as used herein, includes, but is not limited to, diodes, transistors, rectifiers and integrated circuits. Unpackaged semiconductor devices are frequently referred to as "chips" and are so referred to herein.

Bonding of chips to substrates has been the subject of much activity, and particularly the bonding of integrated circuit chips to substrates, due to the multiple terminals on integrated circuit chips. Most bonding has been done manually, on a plurality of special purpose devices utilizing micro-manipulators and alignment optics. In a typical operation, an operator uses a vacuum tool to pick up a chip and then positions it over a substrate. He then "die" bonds the back (nonactive face) of the chip to the substrate (e.g., by forming a eutectic silicon-gold bond, which bond is strong and highly thermally conductive). Next the operator positions a second device with a capillary tip, through which a multiplicity of fine gold or aluminum wires are fed and then welded to connect the substrate conductors to the terminals on the face up (active) side of the chip.

Recent techniques have involved direct active face down bonding of chip terminals to the substrate or package without wires. Chip alignment to a package or substrate is typically accomplished by such methods as (1) the infrared technique of U.S. Pat. No. 3,465,150 or (2) by the use of visible light and mirrors, often by reference to cross hairs in a microscope, since chips are opaque to visible light.

There is a need for an apparatus capable of precision attachment of chips in a continuous manner to a continuous carrier at high productivity rates. This apparatus should be capable of providing strong, low resistance package interconnections between chip terminal and complex substrate circuit patterns, and should employ direct, visible-light axial alignment optics.

SUMMARY OF THE INVENTION

This application provides an apparatus for continuous packaging of semiconductor chips, that is, for inboard bonding of the active face of such chips to the metallizations on flexible transparent carrier for such chips, die bonding of the nonactive face of the chip to a substrate, and outboard bonding of substrate metallizations to carrier metallizations. A continuous strip of carriers for such chips is employed, which carrier strip comprises a series of carrier units each of which comprises A. a flexible transparent film base;

B. metallic conductor patterns on one surface of film (A), for electrical contact between the chip and the substrate; and C. metallic bonding pads on patterns (B) for contact between patterns (B) and the chip.

The patterns (B) may be convergent to the center of film (A). There are index holes on the strip between said carrier units. The preferred film base is polyimide. Such carrier units and strips thereof are described in the above-mentioned copending application Ser. No. 118,803. The carriers and carrier strips used here are transparent so that axial optics can be employed to inspect alignment in the apparatus and method of the present invention.

The apparatus of the present invention is useful in packaging semiconductor chips generally, and of greatest use in packaging integrated circuit chips due to the multiple terminals thereon.

In the present apparatus, windowless carriers are preferably employed, i.e., the carrier center need not be cut to allow bonding. Furthermore, the apparatus of the present invention allows alignment of chip and carrier by direct visible light axial optics, as opposed to the previous infrared and mirror techniques.

The apparatus of the present invention provides two units, (1) an inboard bonding unit and (2) a die and outboard bonding unit. Optionally, there is disposed between the inboard bonding unit and the die and outboard bonding unit a testing apparatus, for testing carrier-mounted chips prior to final commitment of the package. The die and outboard unit optionally comprises a package cut out means at the same station. Also provided are individual inboard bonding units as well as individual die and outboard bonding units.

The inboard bonding unit comprises, in operative disposition, a. a block under which the carrier strip is passed, with the surface bearing conductor patterns (B) facing away from said block, said block having a transparent plate therein and a cavity disposed between the transparent plate and the path of the carrier strip;

b. means for feeding said carrier strip past block (a);

c. means for supplying oriented chips singly and face up underneath and to the surface of the carrier strip which bears conductor patterns (B), as that surface is positioned under the transparent plate in block (a);

d. a bonding tool disposed under the transparent plate, carrier strip and chip;

e. index means for locking the carrier strip in place under the transparent plate during bonding operations;

f. means for locking the chip in place under the carrier and adjacent to the bonding pads of the carrier;

g. means for examining the chip to carrier alignment through the transparent plate;

h. means for adjusting the chip to carrier alignment;

i. means for raising the bonding tool (d) and pushing the terminals of the active side of the chip into contact with the pads (C) of the carrier unit, and applying pressure thereto;

j. means for bonding the carrier pads (C) to the chip terminals after means (i) has functioned;

k. means to retract tool (d) after bonding; and l. means to advance the chip after it has been bonded to the carrier, and thus advance to the transparent plate another carrier unit and chip for the bonding operation.

Means (f) in the inboard bonding unit may be a vacuum means which pulls the carrier unit up into the slight cavity in block (a). Means (j) may be either an ultrasonic bonding tool or a thermocompression bonding apparatus.

The die and outboard bonding unit comprises, in operative disposition, a. a bonding block comprising (1) two plates between which said carrier strip having chips mounted thereon is passed, at least one of the plates being movable to apply pressure to compress the nonactive face of the chip against the die bonding pad of the substrate in proper registry, and (2) means for die bonding the die bonding pad on the substrate to the nonactive face of the chip;
b. means for feeding a continuous strip of carrier-mounted chips past bonding block (a);
c. means for feeding an oriented substrate to bonding block (a) to a position under the carrier-mounted chip;
d. a bonding tool movable through the plate which is adjacent to the surface of the carrier strip which does not bear conductor patterns (B), for outboard bonding of the conductor patterns (B) to the substrate conductors, after die bonding of chip to substrate has been completed;
e. means for applying pressure to tool (d) to affect said outboard bonding;
f. means for retracting tool (d) after outboard bonding;
g. means for retracting at least one of plates (a); and
h. means to advance the resultant package and thereby advance to bonding block (a) another carrier-mounted chip.

Die bonding in this unit may be accomplished either by soldering, formation of eutectic die bonds, or by cementing with an adhesive such as an epoxy. Thus, the plate in bonding block (a), which is adjacent to the substrate, is provided with means for heating the same where necessary, and with dispensing means where necessary (e.g. for glue or solder). Block (a) is optionally provided with a cutting tool which is movable vertically to cut out the package, rather than winding up a strip of packaged chips, where desired. Tool (d) may be either an ultrasonic or thermocompression bonding tool. The substrate fed to the die and outboard bonding unit may, for example, be either a strip of punched or etched metal lead frames (without carrier film) or a metallized ceramic object. Where the substrate is a strip of metal lead frames, a cutting tool may be provided for cutting the packaged chip from the carrier strip (only) after die and outboard bonding, and forwarding the strip of packaged chips on lead frames to a station where encapsulation of each of the packaged chips on the lead frame is accomplished, prior to cutting out the resultant encapsulated package from the lead frame strip.

This invention also provides methods for packaging chips using the above apparatus.

DETAILED DESCRIPTION OF THE INVENTION

Figure 1:
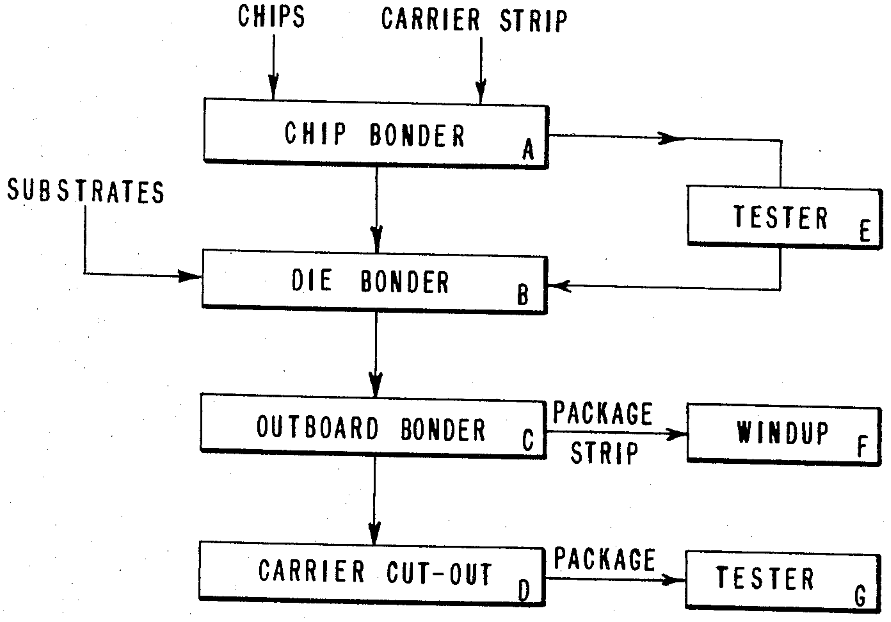
FIG. 1 is a block diagram of the apparatus of the present invention, including optional features.

FIG. 1 is a block diagram outlining the apparatus of the present invention and various embodiments of its use. Chips (e.g., integrated circuit chips) and the carrier strips described above are fed to a chip bonder unit A (described below), wherein each terminal on the active face of each chip is bonded to one of the pads in the center of each carrier unit. Thereafter, the resultant strip of carrier-mounted chips can either be fed to a tester E, wherein the electrical connections are tested, or wound up. Exemplary of useful test probes are those with spring-loaded contact fingers as described in Section 5 of Electronic Production Aids Catalog, Kiver Publications, Chicago, 1970. In any event, electrical testing is desirable prior to introduction of the strip of carrier bonded chips in the next bonding phase. Defectively mounted or damaged chips are marked or indexed during the testing operation, but generally left on the strip for disposal later.

The second bonding apparatus (die-bonder B and outboard-bonder C) performs two bonding functions. First, the carrier strip having chips mounted thereon is fed to the bonding unit along with metallized substrates. The metallized substrates may be varied widely, for example, individual ceramic boards having metal patterns thereon, or a reel of lead frames, or heat sinks. The embodiment wherein the substrate is a metallized ceramic will be discussed first. In die bonding unit (B), the back or inactive face of the chip is bonded to a die bonding pad on the substrate. Then, at the same bonding station, outboard bonding of the carrier conductors to the substrate metallization occurs (C). Thereafter, the strip having packaged chips thereon may be wound up (F) for subsequent processing, or cut out of the individual packages may occur (D). In a preferred embodiment of the present invention, package cut out occurs at the same station as do bonding operations (B) and (C). In FIG. 1, after bonding operation (C), wind up (F) of the package strip and package cut out operation (D) are alternative courses.

Where the substrate is a reel of lead frames, after die bonding in (B) and outboard bonding of an individual lead frame (in the strip of lead frames) to the carrier in (C), the carrier is cut out in (D), but not the lead frame. Thereafter, a strip of lead frame/chip/carrier packages on the lead frame reel is passed to another station where encapsulation of the package, e.g., with polymer, is accomplished. Thereafter, the encapsulated package may be cut from the lead frame selvage, and bent and tested as desired.

In each of bonding steps A, B and C of FIG. 1, bonding may be accomplished by conventional techniques, such as by thermocompression or by ultrasonic techniques. The surfaces to be bonded are, in either instance, brought into contact by the bonding tool, pressure is applied and then heat and/or ultrasonic forces are applied.

Figure 2:
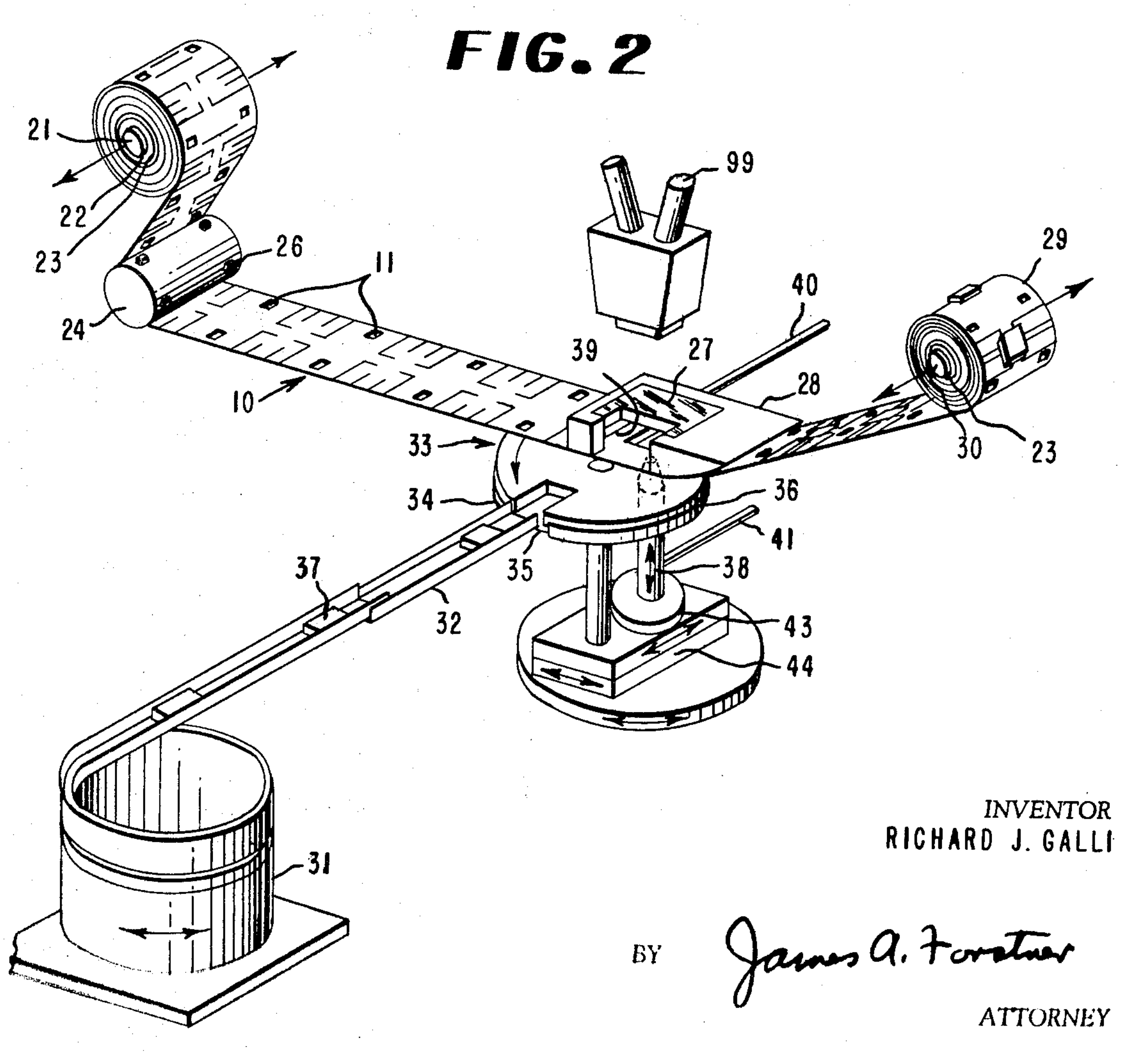
FIG. 2 is a schematic view of a preferred embodiment of the inboard or chip bonder, showing supply and takeup reels.
Figures 3, 4, 5:
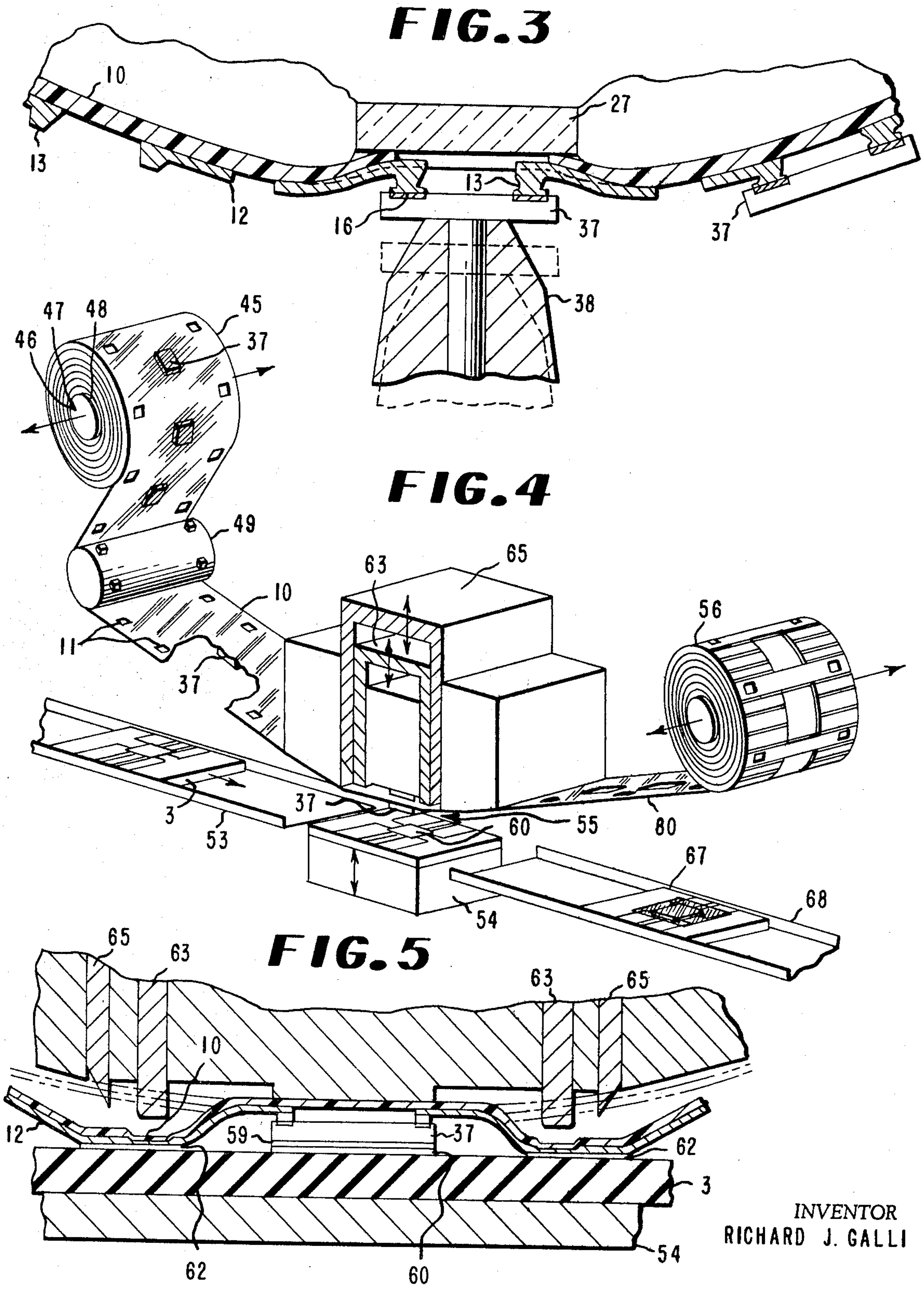
FIG. 3 is a more detailed view of the bonding area of FIG. 2.
FIG. 4 is a schematic view of a preferred embodiment of the die and outboard bonder unit of the present invention, which includes the optional feature of package cut out after bonding.
FIG. 5 is a detailed view of the bonding area of FIG. 4.

FIG. 2 is an isometric view of a carrier strip 10 being unwound from a reel and fed to an automatic apparatus for bonding chips to the carrier strip. FIG. 3 is a cross section of the bonding area of FIG. 2, showing the resilient film base of the carrier strip 10 being compressed in the bonding area; this assures uniform chip bonding. The chip is bonded in a face-up position.

In FIG. 2, the carrier strip reel is loaded into unwind spindle 21, which has an adjustable friction brake 22 and, optionally, axial adjustment means 23 for centering carrier strips of different widths. The carrier strip is then threaded as it proceeds around the index sprocket 24, the sprocket holes 11 in the carrier strip being engaged by the sprocket teeth 26 on index sprocket 24. The carrier strip is then drawn across the bottom of glass view plate 27 and up past guide area 28, and finally around the windup reel 29. Windup reel 29 is mounted on a torque driven spindle 30, which also has optional means for axial adjustment 23.

A commercial vibratory hopper feed device 31, such as made by the Syntron Company, orients and feeds the chips into a flexible feed slide 32. The indexing feed device 33, with a slotted transfer disc 34 with a support plate 35 and an edge rail 36, acquires chip 37 from the feed slide 32 and transfers it to the bonding position under glass view plate 27 and above the bonding tool 38. The carrier index sprocket 24 advances the carrier strip across the bonding station and locks a carrier unit of the strip directly above the chip 37. Tension from the windup reel 29 draws the carrier strip tightly across the glass plate. A vacuum ridge 39, around the bottom of the glass view plate, forms a small space between the back of the carrier film and the glass view plate. This space is then evacuated by vacuum hose 40, drawing the carrier firmly into intimate contact with the glass view plate to provide a firm and rigid coupling at the back of the film for chip bonding.

The alignment of the chip terminals 16 to the carrier bonding pads 13 (shown in FIG. 3) is checked by viewing through both the glass view plate and the transparent plastic carrier film layer, to the chip surface. Viewing is done by microscope 99. Any misalignment observed may be corrected by moving the frame holding the chip feed device 33 and the bonding head, using linear and/or rotary adjustments. Where accurately cut chips are used, the device will stay registered once the initial adjustment is made. When less uniformly cut chips, such as those made by diamond scribing, are used, feeding and automatic orienting can be employed, but more frequent realignment may be required due to variations in chip size.

Once the alignment of chip to carrier is assured, the hollow bonding tool 38 is raised vertically while vacuum suction is applied through second vacuum hose 41. As the tool 38 contacts the bottom of the chip, it holds the chip firmly in registration by vacuum. The tool 38 pushes the terminals on the active side of the chip into contact with the carrier conductor bonding pads 13, and continues to move upward until the force between these surfaces reaches a preset value. The tool 38 is then vibrated by the ultrasonic driver 43 which is mounted on an X–Y, rotary stage 44. Alternately, by heating tool 38, terminals 16 and/or pads 13, bonding may be accomplished by thermocompression techniques. Where conventional chips with aluminum terminals or lands are to be bonded, carrier bonding pads of aluminum and ultrasonic bonding techniques are preferred. Where special chips with terminals other than aluminum are used (e.g., gold) gold carrier bonding pads and thermocompression bonding techniques may be preferable.

As shown in FIG. 3, during the bonding sequence the plastic film of the carrier strip 10 is compressed. The film strip thus functions as an elastomeric cushion that equalizes contact pressure among the separate conductors, even despite minor thickness variations or chip misalignment. This assures simultaneous bonding of all carrier conductor pads 13 to the active surface of the chip. After bonding, vacuum is removed and the tool 38 retracts. The conductors spring back to the surface when the compressive force is reduced.

It is to be stressed that during this bonding operation the condition of the carrier conductors and the active surface of the chip can be readily inspected by axial optics.

To complete the bonding cycle, after the bonding tool 38 has retracted to its starting position, the carrier sprocket indexes, the torque windup pulls the carrier-mounted chip toward the windup reel 29, and a fresh carrier strip section is transferred into exact registration in the bonding position for the next chip bonding operation. Automatic bonding rates of up to 4,000 chips per hour are practical with a system of this type.

If desired, the carrier-mounted chips can be tested (as shown in FIG. 1) by a plurality of probes either between the bonding area and before windup reel 29, or can be tested at a later time on another machine prior to final commitment to a substrate to form a package. Any defective chips detected are marked to identify them for disposal at a convenient point in subsequent operations.

After bonding of the chip to the carrier and testing, the next step involves die bonding (bonding of the back or nonactive face of the chip to the die bonding pad on the substrate to form a silicon/gold eutectic, solder, or adhesive joint) and subsequent outboard bonding (bonding of the carrier conductors to the substrate conductors). Both die and outboard bonding occur in one apparatus according to the present invention; optionally, package cut out can be accomplished at the same bonding station. FIG. 4 illustrates an embodiment of the present invention wherein die bonding, outboard bonding and package cut out all occur at the same station. FIG. 5 is a more detailed cross-sectional view of the bonding area of FIG. 4.

Referring to FIG. 4, reel 45 contains the carrier strip 10 with previously bonded chips 37. Reel 45 is mounted on an unwind spindle 46, which also has an unwind brake 48 for maintaining proper tension; 47 is an optional axial adjustment means. A feed sprocket 49 controls carrier strip registry by engaging with the carrier strip sprocket holes 11. A metallized substrate 3 is loaded into the feed track 53 by a commercial "Syntron" type automatic feeder hopper, not shown. When the bonding cycle is ready to begin, substrate 3 is fed onto the heated die bond block 54 and the sprocket 49 is indexed to present a carrier-mounted chip into the bonding zone 55. The index transfer is accomplished by torque driven reel 56. With the sprocket locked to form a eutectic die bond, the substrate is heated (400°–425 °C.) in its center at die bonding pad 60. Simultaneously, block 54 is elevated until the heated region 60 contacts the underside of the chip 37. As shown in FIG. 5, a bonding pressure is applied until a eutectic die bond 59 is formed between the substrate die bonding pad 60 and the nonactive face of the silicon chip 37. Layer 59 may optionally be solder or adhesive for lower temperature die bonds; chip heat dissipation characteristics are lower than with eutectic die bonds, but may be satisfactory for some applications.

In rapid succession, the outboard carrier conductors 12 are bonded to the substrate conductors 62. This is accomplished by the downward movement of tool 63 (cut away in FIG. 4), to form a bond through plastic carrier film 10, either by thermocompression or ultrasonic techniques. As tool 63 retracts upward, cut out tool 65 (also cut away in FIG. 4) moves down, cutting through the plastic and conductor ends, separating the bonded carrier from the carrier strip selvage 80. Simultaneously, 54 moves down to its original position. Tool 65 then retracts, and carrier feed sprocket 49 is indexed, winding selvage 80 on driven reel 56. On the succeeding bonding cycle, the introduction of a new metallized substrate 3 onto block 54 ejects the finished package 67 onto the exit track 68, where it is forwarded to a testing and final sealing station, not shown in FIGS. 4 and 5.

The apparatus and method of the present invention possess numerous advantages over the art. A reliable automated procedure for packaging semiconductor chips is provided, in which chip to carrier alignment can be inspected by axial optics without requiring either mirrors or infrared light as previously used. The carrier is usually windowless (the center is not cut out), i.e., bonding is accomplished through the flexible carrier strip. Furthermore, the present invention permits simultaneous automatic bonding of all chip terminals to the carrier metallizations and simultaneous automatic bonding of all substrate metallizations (except the die bonding pad where used) to the corresponding carrier metallizations.

I claim:

1. An inboard bonding apparatus for bonding semiconductor chips to a continuous strip of carriers for said chips, prior to bonding each of the resultant carrier-mounted chips to a substrate, said carrier strip comprising a series of carrier units each of which comprises A. a flexible transparent film base, B. metallic conductor patterns on one surface of film (A) for electrical contact between the chip and the substrate, and C. metallic bonding pads on patterns (B) for contact between patterns (B) and the chip;

there being index holes in said strip between said carrier units; wherein said apparatus comprises, in operative disposition, a. an inboard block under which the carrier strip is passed, with the surface bearing conductor patterns (B) facing away from said inboard block having a transparent plate therein and a cavity disposed between the transparent plate and the path of the carrier strip;

b. inboard feeding means for feeding said carrier strip past block (a);

c. inboard supply means for supplying oriented chips singly and face up underneath and to the surface of the carrier strip which bears conductor patterns (B), as that surface is positioned under the transparent plate in inboard block (a);

d. an inboard bonding tool disposed under the transparent plate, carrier strip and chip;

e. index means for locking the carrier strip in place under the transparent plate during bonding operations;

f. means for locking the chip in place under the carrier and adjacent to the bonding pads of the carrier;

g. means for examining the chip to carrier alignment through the transparent plate;

h. means for adjusting the chip to carrier alignment;

i. inboard pressure means for raising the bonding tool (d) and pushing the terminals of the active side of the chip into contact with the pads (C) of the carrier unit, and applying pressure thereto;

j. inboard bonding means for bonding the carrier pads (C) to the chip terminals after means (i) has functioned;

k. inboard retracting means to retract tool (d) after bonding; and l. inboard advancing means to advance the chip after it has been bonded to the carrier, and thus advance to the transparent plate another carrier unit and chip for the bonding operation.

2. An apparatus according to claim 1 wherein locking means (f) is a vacuum means which pulls carrier units up into the cavity in block (a).

3. An apparatus according to claim 1 wherein inboard bonding means (j) is an ultrasonic bonding tool.

4. An apparatus according to claim 1 wherein inboard bonding means (j) is a thermocompression bonding tool.

5. A die and outboard bonding apparatus for bonding metallized substrates to a series of semiconductor chips mounted on a carrier strip, including bonding the nonactive face of a carrier-mounted chip to a die bonding pad on the substrate and outboard bonding of carrier metallizations to substrate metallizations, and thus forming a strip of packaged chips, the carrier strip being a series of carrier units each of which comprises A. a flexible transparent film base, B. metallic conductor patterns on one surface of film (A), for electrical contact between the chip and the substrate, and C. metallic bonding pads on patterns (B) for contact between patterns (B) and the chip;

there being index holes on said strip between said carrier units; said apparatus comprising, in operative disposition, a. an outboard bonding block comprising (1) two plates between which said carrier strip having chips mounted thereon is passed, at least one of the plates being movable to apply pressure to compress the nonactive face of the chip against the die bonding pad of the substrate in proper registry, and (2) die bonding means for die bonding the die bonding pad on the substrate to the nonactive face of the chip;

b. outboard feeding means for feeding a continuous strip of carrier-mounted chips past outboard bonding block (a);

c. outboard supplying means for supplying an oriented substrate to outboard bonding block (a) to a position under the carrier-mounted chip;

d. an outboard bonding tool movable through the plate which is adjacent to the surface of the carrier strip which does not bear conductor patterns (B), for outboard bonding of the conductor patterns (B) to the substrate conductors, after die bonding of chip to substrate has been completed;

e. outboard pressure means for applying pressure to outboard bonding tool (d) to affect said outboard bonding;

f. outboard tool retracting means for retracting outboard bonding tool (d) after outboard bonding;

g. plate retracting means for retracting at least one of plates (a); and h. outboard advancing means to advance the resultant package and thereby advance to outboard block (a) another carrier-mounted chip.

6. An apparatus according to claim 5 wherein die bonding means (a) (2) is a means for heating the plate which is adjacent to the substrate in the area wherein contact has been made between a die bonding pad on the substrate and the nonactive face of the chip, to form a eutectic die bond.

7. An apparatus according to claim 5 wherein die bonding means (a) (2) is a solder dispensing means.

8. An apparatus according to claim 5 wherein die bonding means (a) (2) is an adhesive dispensing device.

9. An apparatus according to claim 5 wherein additionally comprises a cutting tool in that plate of outboard bonding block (a) which also contains movable outboard bonding tool (d), said cutting tool being movable vertically to cut out the package.

10. An apparatus according to claim 5 wherein said outboard bonding tool (d) is an ultrasonic bonding tool.

11. An apparatus according to claim 5 wherein said outboard bonding tool (d) is a thermocompression bonding tool.

12. An apparatus according to claim 5 wherein said metallized substrates are metal lead frames, which are supplied by outboard supplying means (c) to said outboard bonding block (a) as a continuous strip of said lead frames, and wherein said apparatus additionally comprises i. a cutting tool for cutting the bonded chip from the carrier strip after die and outboard bonding; and j. means for advancing a strip of lead frames on which bonded chips are mounted.

13. An apparatus according to claim 12 which additionally comprises k. means to encapsulate each of the bonded chips on said lead frame strip after the cut out operation in (i);

l. means for cutting the resultant encapsulated unit from the lead frame strip; and m. means for maintaining tension on the lead frame strip during said encapsulation and cutting steps.

14. A packaging apparatus for bonding semiconductor chips to a substrate with a continuous strip of carriers for said chip, said carrier strip comprising a series of carrier units each of which comprises A. a flexible transparent film base, B. metallic conductor patterns on one surface of film (A), for electrical contact between the chip and substrate, C. metallic bonding pads on patterns (B) for contact between patterns (B) and the chip;

there being index holes on each said strip between said carrier units, wherein said apparatus comprises, in operative disposition, the inboard bonding apparatus of claim 1 for bonding the active face of said chips to a continuous strip of carriers for said chips, and die and outboard bonding apparatus, for bonding to metallized substrates a series of said chips mounted on a carrier strip, thus forming a strip of packaged chips, comprising in operative disposition a'. an outboard bonding block comprising (1) two plates between which said carrier strip having chips mounted thereon is passed, at least one of the plates being movable to apply pressure to compress the nonactive face of the chip against the die bonding pad of the substrate in proper registry, and (2) die bonding means for die bonding the die bonding pad on the substrate to the nonactive face of the chip;

b'. outboard feeding means for feeding a continuous strip of carrier-mounted chips past outboard bonding block (a');

c'. outboard supplying means for supplying an oriented substrate to outboard bonding block (a') to a position under the carrier-mounted chip;

d'. an outboard bonding tool movable through the plate which is adjacent to the surface of the carrier strip which does not bear conductor patterns (B), for outboard bonding of the conductor patterns (B) to the substrate conductors, after die bonding of chip to substrate has been completed;

e'. outboard pressure means for applying pressure to tool outboard bonding (d') to affect said outboard bonding;

f'. outboard retracting means for retracting tool outboard bonding (d') after outboard bonding;

g'. plate retracting means for retracting at least one of plates (a'); and h'. outboard advancing means to advance the resultant package and thereby advance to outboard bonding block (a') another carrier-mounted chip.

15. An apparatus according to claim 14 which additionally comprises, between the inboard bonding apparatus and the die and outboard bonding, an apparatus to test each of the carrier-mounted chips formed in the inboard bonding apparatus prior to commitment to a package in the die and outboard bonding apparatus.

16. An apparatus according to claim 14 wherein said outboard bonding tool (d') is an ultrasonic bonding tool.

17. An apparatus according to claim 14 wherein outboard bonding tool (d') is a thermocompression bonding tool.

18. An apparatus according to claim 14 wherein die and outboard bonding apparatus additionally comprises a cutting tool in that plate of outboard bonding block (a') which contains movable outboard bonding tool (d'), said cutting tool being movable vertically to cut out the package.

19. A method for packaging semiconductor chips using a strip of carrier units each of which comprises A. a flexible transparent film base, B. metallic conductor patterns on one surface of film (A), for electrical contact between the chip and the substrate, and C. metallic bonding pads on patterns (B) for contact between patterns (B) and the chip;

there being index holes on said strip between said carrier units; wherein said method comprises:

a. feeding said carrier strip under an inboard block with the surface bearing conductor patterns (B) facing away from said inboard block, said inboard block having a transparent plate therein and a cavity disposed between the transparent plate and the path of the carrier strip;

b. applying oriented chips singly and face up underneath and to the surface of the carrier strip which bears conductor patterns (B), as that surface is positioned under the transparent plate in inboard block (a);

c. rigidly holding the carrier strip in place under the transparent plate during bonding operations;

d. locking the chip in place under the carrier and adjacent to the bonding pads of the carrier;

e. examining the chip-two-carrier alignment through the transparent plate;

f. making any necessary adjustments of the chip-two-carrier alignments;

g. pushing the terminals of the active side of the chip into contact with the pads (C) of the carrier unit and applying pressure thereto;

h. bonding the carrier pads (C) to the chip terminals after step (g);

i. advancing the chip after it has been bonded to the carrier, and thus advancing to the transparent plate another carrier unit and chip for the bonding operation;

j. feeding a continuous strip of carrier-mounted chips between two plates of an outboard bonding block;

k. feeding an oriented substrate to said outboard bonding block to a position under the carrier-mounted chip;

l. die bonding the die bonding pads on the substrate to the nonactive face of the chip by means of a die bonding part of said outboard bonding block;

m. outboard bonding of the conductor patterns (B) to the substrate conductors by applying pressure to an outboard bonding tool movable through the plate which is adjacent to the surface of the carrier strip which does not bear conductor patterns (B);

n. retracting said outboard bonding tool after the outboard bonding and retracting at least one of the plates;

o. advancing the resultant package out from between the two plates of said outboard bonding block.

20. The method of claim 19 further comprising cutting out the resultant package prior to advancing the resultant package from out of between said two plates.

21. The method of claim 19 further comprising testing a carrier-mounted chip after bonding the carrier pads (C) to the chip terminals in step (h) and prior to die bonding the die bonding pad on the substrate to the nonactive face of the chip in step (k).

* * * * *